United States Patent
Kim et al.

(10) Patent No.: US 8,441,859 B2
(45) Date of Patent: May 14, 2013

(54) FLASH MEMORY DEVICE AND METHOD OF PROGRAMMING SAME

(75) Inventors: Moo Sung Kim, Yongin-si (KR); Han-Jun Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 223 days.

(21) Appl. No.: 12/914,127

(22) Filed: Oct. 28, 2010

(65) Prior Publication Data
US 2011/0138111 A1      Jun. 9, 2011

(30) Foreign Application Priority Data

Dec. 3, 2009    (KR) .................. 10-2009-0119297

(51) Int. Cl.
*G11C 16/04*       (2006.01)
(52) U.S. Cl.
USPC ............ 365/185.19; 365/185.03; 365/185.17; 365/185.18; 365/185.33
(58) Field of Classification Search ............. 365/185.17, 365/185.19, 185.03
See application file for complete search history.

(56) References Cited

U.S. PATENT DOCUMENTS

| | | | |
|---|---|---|---|
| 7,881,110 B2 | 2/2011 | Park | |
| 7,881,115 B2 | 2/2011 | Kim et al. ............... 365/185.17 |
| 2005/0083735 A1* | 4/2005 | Chen et al. ............... 365/185.17 |
| 2006/0215454 A1* | 9/2006 | In et al. ..................... 365/185.17 |
| 2006/0274564 A1* | 12/2006 | Kim .......................... 365/100 |
| 2008/0062770 A1 | 3/2008 | Tu et al. | |
| 2008/0151632 A1* | 6/2008 | Kim et al. ................ 365/185.18 |
| 2008/0205160 A1 | 8/2008 | Kim et al. | |
| 2010/0008138 A1 | 1/2010 | Wang | |
| 2010/0103733 A1 | 4/2010 | Hemink | |

FOREIGN PATENT DOCUMENTS

| | | |
|---|---|---|
| KR | 1020080079500 A | 9/2008 |
| KR | 1020080113919 A | 12/2008 |
| KR | 1020090074735 A | 7/2009 |

\* cited by examiner

*Primary Examiner* — Pho M Luu
*Assistant Examiner* — Thao Bui
(74) *Attorney, Agent, or Firm* — Volentine & Whitt, PLLC (57) ABSTRACT

A flash memory device includes a memory cell array made up of memory cells arranged in rows and columns. A first page of data is programmed in selected memory cells of the memory cell array, and a second page of data is subsequently programmed in the selected memory cells. The first page of data is programmed using a program voltage having a first start value, and the second page of data is programmed using a program voltage having a second start value determined by a programming characteristic of the selected memory cells.

16 Claims, 8 Drawing Sheets

FLASH MEMORY DEVICE AND METHOD OF PROGRAMMING SAME

CROSS-REFERENCE TO RELATED APPLICATIONS

This application claims priority under 35 U.S.C. §119 to Korean Patent Application No. 10-2009-0119297 filed on Dec. 3, 2009, the disclosure of which is hereby incorporated by reference in its entirety.

BACKGROUND

Embodiments of the inventive concept relate generally to electronic memory technologies. More particularly, embodiments of the inventive concept relate to semiconductor memory devices that can be electrically erased and programmed.

Semiconductor memories play an important role in a wide variety of modern electronic devices, ranging from satellites to consumer products. Consequently, advances in semiconductor memory technology can lead to significant improvements in a broad range of technical applications.

Semiconductor memory devices can be broadly classified into two categories based on whether or not they retain stored data when disconnected from power. These categories include volatile semiconductor memory devices, which lose stored data when disconnected from power, and nonvolatile semiconductor memory devices, which retain stored data when disconnected from power. Examples of volatile memory devices include static random access memory (SRAM) devices and dynamic random access memory (DRAM) devices. Examples of nonvolatile memory devices include various types of read only memory (ROM), such as MROM, PROM, EPROM, and EEPROM. There are also hybrid forms of memory comprising nonvolatile and volatile parts, such as nonvolatile RAM (nvRAM) devices.

Nonvolatile memory devices are commonly used to store programs, microcode, and other information in applications such as a computers, avionics, telecommunications, and consumer electronics. Many of these applications require the nonvolatile memory devices to have fast access and programming characteristics. Accordingly, certain nonvolatile memory devices have been developed with specific structures and logic circuits to optimize performance for application-oriented work.

Flash memory is a form of EEPROM that has achieved increasing popularity in recent years. Among other things, flash memory is relatively inexpensive and provides high performance and data storage capacity compared with other forms of nonvolatile memory. In addition, flash memory is resistant to physical shock, which has made it especially popular for use in mobile devices, such as cellular phones, digital cameras, netbook computers, and so on.

In flash memories, the memory cells are typically configured in one of two configurations, including a NOR configuration, and a NAND configuration. Flash memories having these configurations are referred to as NOR flash memories and NAND flash memories, respectively. The NOR configuration tends to provide faster access speed, but lower storage capacity, compared with the NAND configuration. Accordingly, NOR flash memories are often used to store information requiring fast access, such as code, while NAND flash memories are generally used to provide mass data storage capability for information such as multimedia information, data files, and so on.

Most flash memories store one bit of data per memory cell. However, flash memories have been developed to store more than one bit of data per memory cell. Flash memories that store more than one bit of data per memory cell are referred to as multi-level cell (MLC) flash memories.

SUMMARY

Embodiments of the inventive concept provide various flash memory devices, memory systems comprising flash memory devices, and methods of programming flash memory devices. Certain embodiments are adapted to improve programming performance and power consumption of the flash memory devices.

According to one embodiment of the inventive concept, a flash memory device, comprises a memory cell array comprising a plurality of memory cells arranged in rows connected to corresponding wordlines, and columns connected to corresponding bitlines, wherein each row of memory cells is configured to store multiple pages of data through the corresponding wordline. The flash memory device further comprises a voltage generation circuit configured to generate a program voltage to be applied to a selected wordline among the wordlines connected to the plurality of memory cells. The flash memory device still further comprises a program voltage controller configured to detect a program characteristic of selected memory cells connected to the selected wordline during programming of a first page of data in the selected memory cells, and to control a start level of a program voltage to be applied to the selected memory cells in a program operation used to store a second page of data.

In certain embodiments, the second page of data is an upper level page of data, and the first page of data is a lower level page of data.

In certain embodiments, the start level of the program voltage is an initial voltage in an incremental step pulse programming method.

In certain embodiments, the voltage generation circuit generates the program voltage based on a program code received from the program voltage controller.

In certain embodiments, during programming of the first page of data, the program voltage controller stores the program code with a modified value corresponding to a program voltage applied to the selected memory cells in a program loop where a first off-cell is detected.

In certain embodiments, the program voltage controller provides the program code with the modified value to the voltage generation circuit to determine the start level of the program voltage to be applied to the selected memory cells in the program operation used to store the second page of data.

In certain embodiments, the program voltage controller determines whether the first page has been programmed before the second page is programmed.

In certain embodiments, upon determining that the first page has not been programmed, the program voltage controller designates a fixed default value as the start level of the program voltage to be applied to the selected memory cells in the program operation used to store the second page of data.

In certain embodiments, the program characteristic of the first page is determined by a memory cell with a highest program speed among the selected memory cells.

According to another embodiment of the inventive concept, a method is provided for programming a flash memory device comprising memory cells arranged in wordlines and bitlines. The method comprises programming a first page of data in selected memory cells using an incremental step pulse programming method with a program voltage having a start level of a first magnitude, detecting a program loop of the incremental step pulse programming method in which one or more of the selected memory cells becomes an off-cell, and storing the level of the program voltage in the program loop as a second magnitude, and programming a second page of data in the selected memory cells using an incremental step pulse programming method with the program voltage having a start level of the second magnitude.

In certain embodiments, the method further comprises, upon receiving a request to program the second page of data, determining whether the first page of data is programmed in the selected memory cells.

In certain embodiments, the method further comprises, upon determining that the first page of the selected wordline is not programmed in the selected memory cells, programming the second page of data using an ISPP method with the program voltage having the start level of the first magnitude.

In certain embodiments, the flash memory device is a NAND flash memory device having an all bitline architecture.

In certain embodiments, the method further comprises determining whether the selected memory cells are successfully programmed.

In certain embodiments, determining whether the selected memory cells are successfully programmed is performed before or after detecting a program loop of the ISPP method in which one or more of the selected memory cells becomes an off-cell.

In certain embodiments, the flash memory device is a multi-level cell flash memory device storing M bits per memory cell, where M is an integer greater than 2.

In certain embodiments, the program voltage is determined by a program code that is updated in successive program loops of an ISPP method.

According to still another embodiment of the inventive concept, a memory system comprises a flash memory device, and a memory controller configured to control the flash memory device. The flash memory device comprises a memory cell array comprising memory cells arranged in rows and columns, a voltage generation circuit configured to generate a program voltage to be applied to selected memory cells in a row of the memory cell array, and a program voltage controller configured to control a start level of the program voltage such that a first page of data is programmed in the selected memory cells with the start level having a first value, and a second page of data is programmed in the selected memory cells with the start level having a second value based on a measured programming characteristic of the selected memory cells.

In certain embodiments, the measured programming characteristic is a measure of a programming speed of the selected memory cells.

In certain embodiments, the measure of the programming speed is a number of program loops in an incremental step pulse programming method.

BRIEF DESCRIPTION OF THE DRAWINGS

The drawings illustrate selected embodiments of the inventive concept. In the drawings, like reference numbers indicate like features.

DETAILED DESCRIPTION OF EMBODIMENTS

Embodiments of the inventive concept are described below with reference to the accompanying drawings. These embodiments are presented as teaching examples and should not be construed to limit the scope of the inventive concept.

In the description that follows, where an element is referred to as being "connected" or "coupled" to another element, it can be directly connected or coupled to the other element or intervening elements may be present. In addition, the terms "comprises" and/or "comprising," or "includes" and/or "including" indicate the presence of stated features, regions, integers, steps, operations, elements, and/or components, but do not preclude the presence or addition of one or more other features, regions, integers, steps, operations, elements, components, and/or groups thereof.

Figure 1:
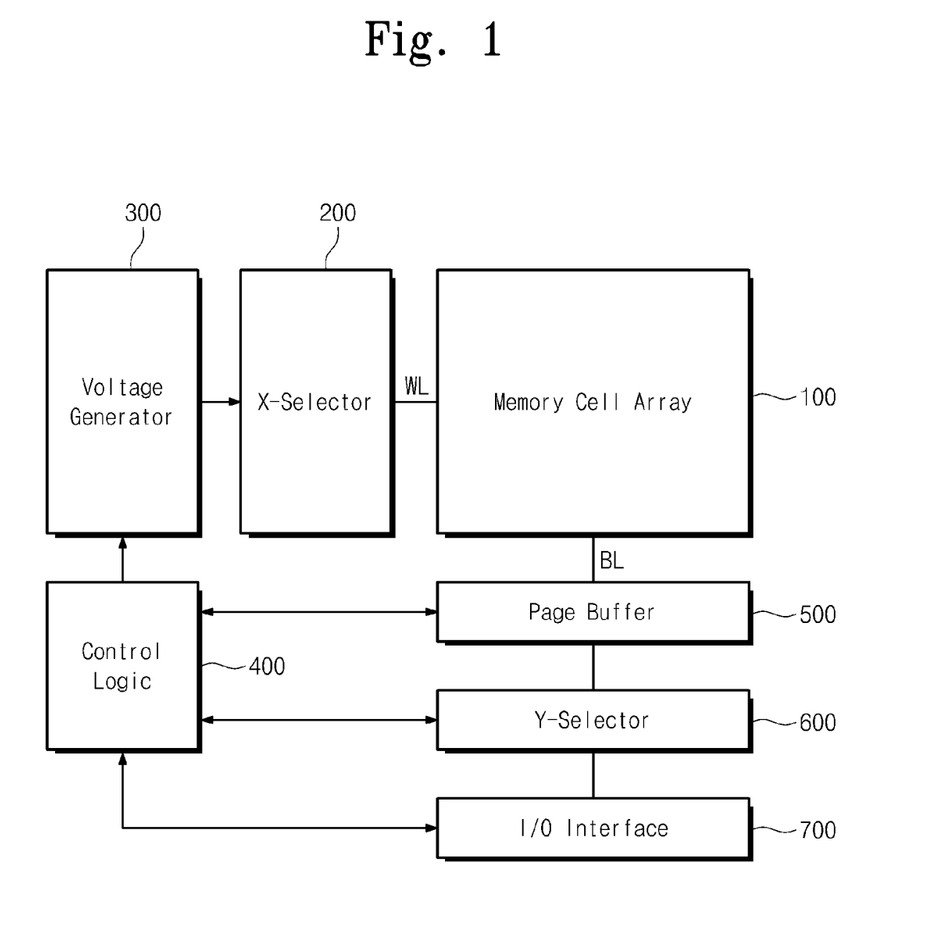
FIG. 1 is a block diagram illustrating a flash memory device in accordance with an embodiment of the inventive concept.

FIG. 1 is a block diagram illustrating a flash memory device in accordance with an embodiment of the inventive concept. For explanation purposes, it will be assumed that the flash memory device of FIG. 1 is a NAND flash memory device. In other embodiments, however, the flash memory device can be a NOR flash memory device, or another type of flash memory device.

Referring to FIG. 1, the flash memory device comprises a memory cell array 100, a row select circuit 200, a voltage generation circuit 300, a control logic 400, a page buffer circuit 500, a column select circuit 600, and an input/output interface 700.

Memory cell array 100 comprises memory cells arranged in rows corresponding to wordlines WL, and columns corresponding to bitlines BL. Each memory cell stores 1-bit data or M-bit data, where M is an integer greater than one. In various embodiments, the memory cells can store information using a charge storage layer such as a floating gate or a charge trap layer, or a variable resistance device. In various embodiments, memory cell array 100 can be implemented with a single-layer array structure, called a two-dimensional array structure, or a multi-layer array structure, called a three-dimensional array structure. Examples of two and three dimensional array structures are disclosed, for instance, in U.S. Patent Publication No. 20080/0023747 entitled "Semiconductor Memory Device with Memory Cells on Multiple Layers", and U.S. Patent Publication No. 2008/0084729 entitled "Semiconductor Device with Three-Dimensional Array Structure", the respective disclosures of which are hereby incorporated by reference in their entirety.

Row select circuit 200 is configured to perform selection and driving operations on rows of memory cell array 100.

Voltage generation circuit 300 is controlled by control logic 400 and is configured to generate voltages for program operations, erase operations, and read operations. These voltages can include, for instance, program voltages, pass voltages, erase voltages, read voltages, and so on.

Control logic 400 is configured to control the overall operation of the flash memory device. Moreover, control logic 400 is configured to determine a start level of a program voltage of voltage generation circuit 300 based on a program speed or other characteristic of memory cells connected to each wordline. For instance, in some embodiments, control logic 400 determines a program characteristic, such as a program speed, of memory cells connected to a wordline upon programming a first page (e.g., a least significant bit (LSB) page) of data in the memory cells, and then determines a start level of a program voltage for a next page (e.g., a most significant bit (MSB) page or intermediate and MSB pages) according to the determined program characteristic. Thus a start level of a program voltage for each wordline can be individually/independently controlled by a program result of a first page of data. It is possible to improve program performance of a flash memory device by determining a start level of a program voltage considering a program speed of memory cells connected to each wordline.

Page buffer circuit 500 is controlled by control logic 400 and operates as a sense amplifier or a write driver according to an operation being performed. For example, in a read operation, page buffer circuit 500 operates as a sense amplifier to sense data from memory cells of a selected row. Page buffer circuit 500 comprises page buffers corresponding to bitlines or pairs of bitline. Where each of the memory cells in memory cell array 100 stores multi-bit data, each page buffer of page buffer circuit 500 can be configured to have two or more latches to sense the multi-bit data.

Column select circuit 600 is controlled by control logic 400 and sequentially selects columns or page buffers when a read or program operation is performed.

Input/output interface 700 is configured to interface with external entities, such as a memory controller or a host.

Figure 2:
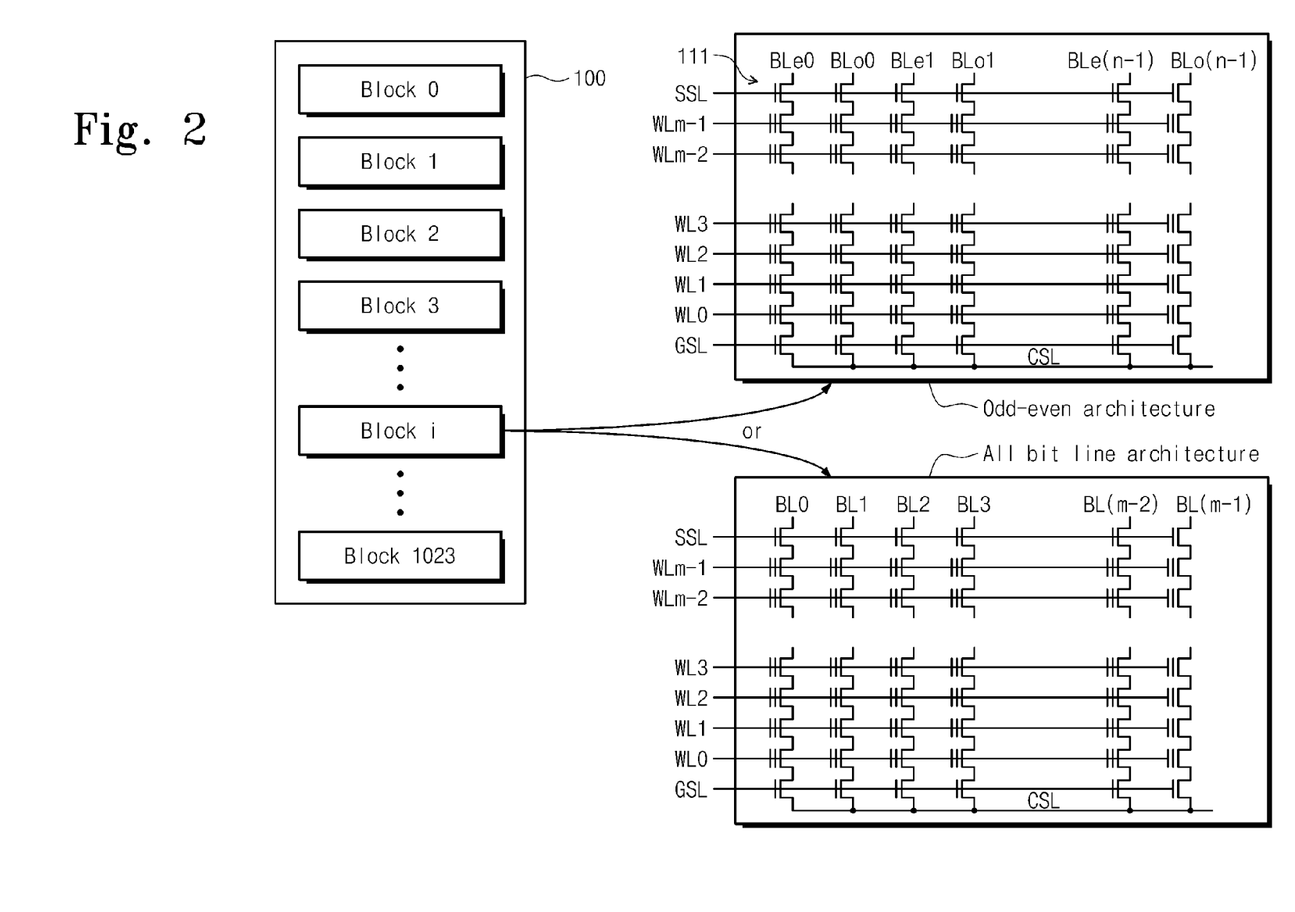
FIG. 2 is a diagram illustrating two alternative configurations of a memory block in the flash memory device of FIG. 1.

FIG. 2 is a diagram illustrating two alternative configurations for memory blocks in memory cell array 100. These two configurations include an all bitline configuration and an odd-even configuration.

Referring to FIG. 2, memory cell array 100 comprises a plurality of memory blocks Block 0 through Block 1023. Each of the memory blocks comprises a plurality of pages of data, and data is programmed or read on a page by page basis and erased on a block by block basis.

FIG. 2 shows two different configurations of a memory block "i" of memory cell array 100. A first configuration of memory block "i" is an odd-even configuration, and a second configuration of memory block "i" is an all bitline configuration, as will be described in further detail below.

Both configurations of memory block "i" are NAND flash configurations comprising a plurality of NAND strings, where each NAND string comprises a plurality of memory cells arranged in series between a string select transistor controlled by a string select line SSL and a ground select transistor controlled by a ground select line GSL. Each NAND string is connected between a corresponding bitline, and a common source line CSL.

The NAND strings in both configurations of memory block "i" are connected to corresponding bitlines. In the odd-even configuration of memory block "i", a NAND string 111 is connected to a bitline BLe0. In addition, the memory cells in the NAND strings are connected to wordlines WL0 through WLm−1. Each wordline connects in parallel to a plurality of memory cells of different NAND strings.

In the odd-even configuration of memory block "i", read and program operations are performed by selecting one of wordlines WL0 through WLm−1 and reading or programming data in odd or even memory cells connected to the selected wordline. The odd memory cells are the memory cells connected to odd bitlines, and the even memory cells are the memory cells connected to even bitlines.

In the all bitline configuration of memory block "i", read and program operations are performed by selecting one of wordlines WL0 through WLm−1 and reading or programming data in all of the memory cells connected to the selected wordline—not just the odd or even memory cells.

In certain embodiments, each wordline is connected to 1 KB or 2 KB memory cells, so data can be stored in page units of 1 KB or 2 KB. In certain embodiments, memory cell array 100 can be formed with memory blocks having a three-dimensional array structure.

Figure 3:
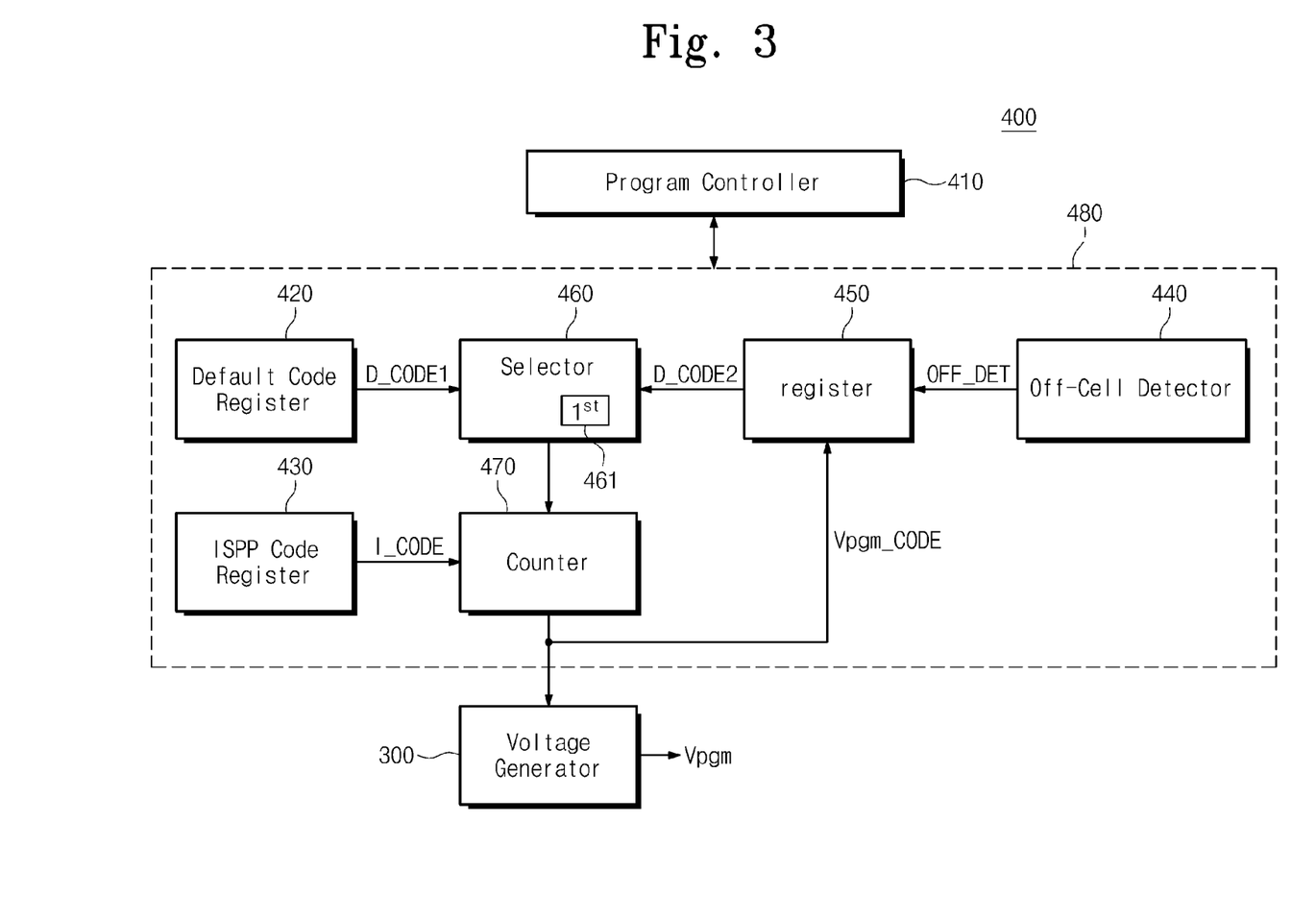
FIG. 3 is a block diagram illustrating an embodiment of control logic in the flash memory device of FIG. 1.

FIG. 3 is a block diagram illustrating an embodiment of control logic 400 of FIG. 1.

In the embodiment of FIG. 3, control logic 400 controls a start level of a program voltage Vpgm of voltage generation circuit 300 based on program characteristics of different pages in memory cell array 100. In other words, the start level of program voltage Vpgm is independently controlled for different pages of memory cell array 100 so that some or all of the pages receive a different initial program voltage Vpgm based on their respective program characteristics.

In the description that follows, it will be assumed that the memory cells in memory cell array 100 are multi-level cells, and each wordline is connected to a plurality of multi-level cells that can be used to store multiple pages of data. Accordingly, where the description refers to programming a "page of a wordline", it means programming a page of data in memory cells connected to a wordline. Moreover, a page of lower level data refers to a page of lower bit order data, such as LSB data, to be programmed in the multi-level cells connected to a wordline, a page of upper level data refers to a page of higher bit order data, such as MSB data, to be programmed in the multi-level cells connected to a wordline.

In some embodiments, program voltage Vpgm is applied to each wordline of memory cell array 100 with the same level when programming pages of lower level data, such as LSB pages of multi-level cells. However, when programming pages of upper level data, such as MSB pages of multi-level cells, program voltage Vpgm is adjusted to have different start levels based on programming characteristics of the different multi-level cells. The programming characteristics can be determined for the different multi-level cells based on the programming of the lower level data. The variation of program voltage Vpgm will be described in further detail below.

Referring to FIG. 3, control logic 400 comprises a program controller 410 and a program voltage controller 480. Program controller 410 is configured to control the overall operation of a flash memory device. However, program controller 410 can also be configured to control other operations such as an erase operation, a read operation, and a verification read operation. Program voltage controller 480 controls a start level of program voltage Vpgm generated by voltage generation circuit 300 according to whether a page of a wordline has been programmed.

Program voltage controller 480 comprises a default code register 420, an incremental step pulse programming (ISPP) code register 430, an off-cell detector 440, a program code register 450, a selector 460 and a counter 470.

Default code register 420 stores a first default code D_CODE1 indicating a start level of a program voltage Vpgm applied to a flash memory device in a programming operation. First default code D_CODE1 indicates a fixed start level of program voltage Vpgm that can be used when programming pages of data in memory cell array 100. In other words, first default code D_CODE1 does not differ for different wordlines. First default code D_CODE1 can be used, for instance, to program pages of lower level data in memory cell array 100 with the same start level of program voltage Vpgm.

First default code D_CODE1 can be obtained through a test of memory cell array 100. For example, the start level of program voltage Vpgm can be determined based on a program speed of memory cells in memory cell array 100, such as a program speed of a memory cell having a highest program speed. However, a method of determining a start level of a program voltage Vpgm is not limited thereto. First default code D_CODE1 is provided to selector 460 when a program operation is performed.

ISPP code register 430 stores an ISPP code I_CODE indicating an increment of program voltage Vpgm to be used in successive loops of an ISPP method. In the ISPP method, program voltage Vpgm is applied to selected memory cells with a magnitude that increases by an incremental amount in successive program loops until the selected memory cells reach desired threshold voltages. ISPP code I_CODE indicates the amount of the increment. In each of the program loops, a verification reading operation is performed to determine whether the selected memory cells have reached the desired threshold voltages.

Off-cell detector 440 detects whether at least one of the memory cells in a selected page is an off-cell during the verification reading operation. A memory cell is detected as an off-cell if it is not turned on by a verification read voltage in the verification reading operation. Off-cell detector 440 outputs a detection signal OFF_DET as an active high signal based on the detection. Activation of detection signal OFF_DET indicates that at least one memory cell in the selected page has become an off-cell. Off-cell detector 440 is activated during programming of a first page of each wordline. Once detection signal OFF_DET is activated, off-cell detector 440 does not perform off-cell detection in subsequent program loops.

Off-cell detector 440 can use any of several techniques to detect an off-cell during programming of the first page of each wordline. As examples, off-cell detector 440 can detect the off-cell by initializing latches of page buffers, sensing states of selected memory cells, and determining whether at least one of the sensed states has an off-cell state.

Program code register 450 stores a program code Vpgm_CODE output by counter 470 in response to activation of detection signal OFF_DET. Program code Vpgm_CODE is a code used to generate program voltage Vpgm.

A second default code D_CODE2 stored in program code register 450 is used to determine a start level of a program voltage Vpgm used to program remaining pages of each wordline after the first page has been programmed. Second default code D_CODE2 is provided to selector 460 when a program operation is requested with respect to remaining pages of each wordline, such as MSB pages or intermediate and MSB pages. Unlike first default code D_CODE1, second default code D_CODE1 has different values for different pages of different wordlines. Accordingly, while first default code D_CODE1 indicates a single default start level of program voltage Vpgm to use when programming the first pages of all wordlines, second default code D_CODE2 can indicate different default start levels of program voltage Vpgm to use when programming pages other than the first pages.

Selector 460 selects one of first default code D_CODE1 and second default code D_CODE2, and provides the selected default code to counter 470. Selector 460 comprises a register 461 for storing flag information indicating whether first pages of respective wordlines have been programmed. Selector 460 determines whether the first page of a selected wordline is yet to be programmed based on the flag information stored in register 461. Where the first page of the selected wordline is yet to be programmed, selector 460 outputs first default code D_CODE1 to counter 470. Otherwise, where the first page of the selected wordline is already programmed, selector 460 outputs second default code D_CODE2 to counter 470.

Counter 470 receives the default code selected by selector 460 and ISPP code I_CODE. Then, in a first program loop of a program operation, counter 470 outputs the selected default code as program code Vpgm_CODE. Voltage generation circuit 300 receives program code Vpgm_CODE and generates program voltage Vpgm with a start level corresponding to Vpgm_CODE, which is the selected default code. Thereafter, in a next program loop, counter 470 modifies the value of program code Vpgm_CODE based on ISPP code I_CODE so that program voltage Vpgm increases by an amount corresponding to ISPP code I_CODE.

During a program operation of a first page of a selected wordline, once a first off-cell is detected, a current value of program code Vpgm_CODE is stored in program code register 450 to be used as the second default code D_CODE2 for the selected wordline. Then, in a program operation of the remaining pages of the selected wordline, the stored value of program code Vpgm_CODE stored in program code register 450 is provided to voltage generation circuit 300 through selector 460 and counter 470 as a default code.

Although not illustrated in the drawings, a pass/fail check circuit can be incorporated in control logic 400 to check whether selected memory cells have been successfully programmed. Such a check can be performed either before or after off-cell detection is performed by off-cell detector 440. The pass/fail check circuit can be located, for instance, in program controller 410 or program voltage controller 480. In addition, it is possible to implement control logic 400 so that the pass/fail detection and off-cell detection are performed through one circuit.

Figure 4:
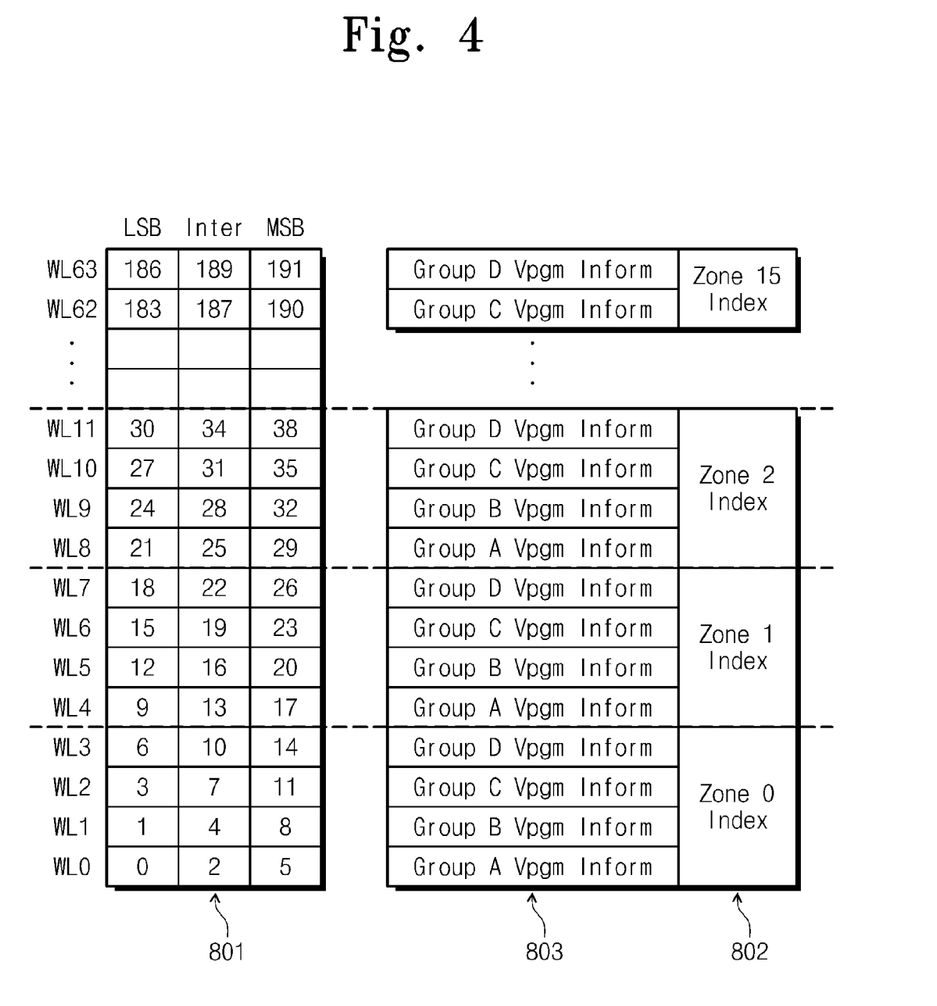
FIG. 4 is a diagram for explaining a method of storing program code in a program code register within the control logic of FIG. 3 in accordance with an embodiment of the inventive concept.

FIG. 4 is a diagram for explaining a method of storing a program code in program code register 450 in accordance with an embodiment of the inventive concept.

In the example of FIG. 4, a memory block comprises memory cells each storing three-bit data. The memory cells are arranged in 64 rows connected to 64 corresponding wordlines WL0 through WL63. Boxes 801, 802, and 803 comprise rows corresponding to wordlines WL0 through WL63 and pages of data stored in memory cells connected to the wordlines.

Box 801 represents an example programming order of LSB pages, intermediate pages, and MSB pages of wordlines WL0 through WL63. In particular, the numbers 0 through 191 within box 801 indicate an order in which data is stored in the pages of memory cells connected to wordlines WL0 through WL63. A first column of box 801 represents LSB data, a second column of box 801 represents intermediate data and a third column of box 801 represents MSB data.

Box 802 represents a plurality of zones (e.g., 16 zones) corresponding to wordlines WL0 through WL63. Each zone corresponds to four wordlines, and each of the four wordlines corresponds to one of four groups indicated in box 803. For example, wordlines WL0 through WL3 correspond to zone 0 and respective first through fourth groups A, B, C, and D.

Box 803 represents program information for each of first through fourth groups A, B, C, and D of zones 0 through 15.

The program information comprises a program code Vpgm_CODE for each entry in box 803. Accordingly, the program information indicates a value of program voltage Vpgm when at least one memory cell in a page is detected as an off-cell.

As indicated by the programming order in box 801, all of the pages in zone 0 are programmed before any of the pages in zone 2 are programmed. Similarly, all of the pages in zone 1 are programmed before any of the pages in zone 3 are programmed, and so on. Accordingly, no more than two zones are programmed at overlapping times. Accordingly, as will be explained in relation to FIG. 5, only two zones worth of information must be stored in program code register 450 at one time to ensure that the programming of upper level data in each zone is based on programming characteristics detected during programming of corresponding lower level data.

Figure 5:
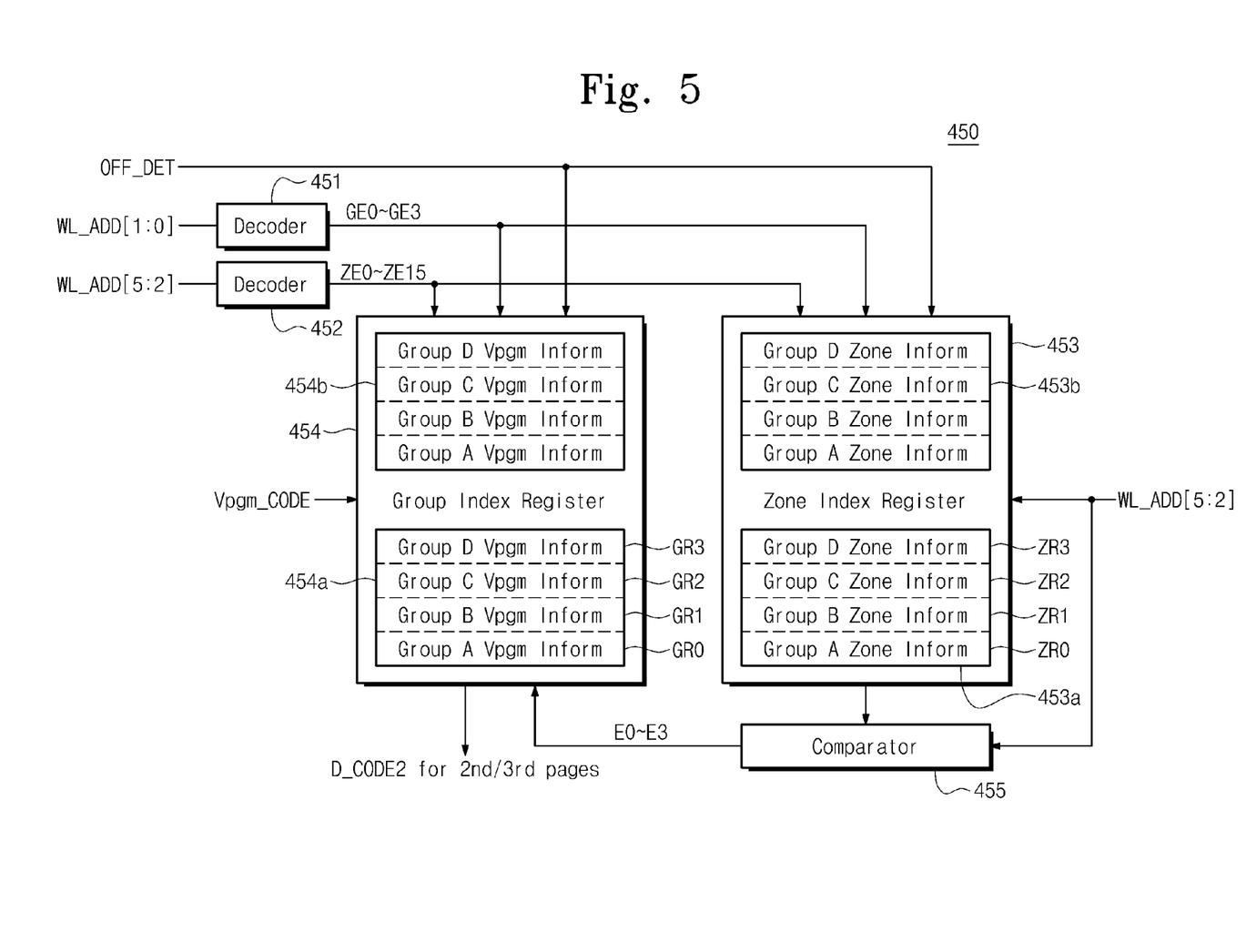
FIG. 5 is a block diagram illustrating an embodiment of the program code register of FIG. 3.

FIG. 5 is a block diagram illustrating an embodiment of program code register 450. In the embodiment of FIG. 5, program code register 450 comprises first and second decoders 451 and 452, first and second register sets 453 and 454, and a comparator 455.

First and second decoders 451 and 452 each decode a portion of a row address WL_ADD[5:0], which is used to address word lines WL0 through WL63.

First decoder 451 decodes a first address WL_ADD[1:0] of row address WL_ADD[5:0] and activates group select signals GE0 through GE3 based on the decoded first address. Group select signals GE0 through GE3 are provided to first and second register sets 453 and 454.

Second decoder 452 decodes a second address WL_ADD[5:2] of row address WL_ADD[5:0] and activates zone select signals ZE0 through ZE15 based on the decoded second address. Zone select signals ZE0 through ZE15 are provided to first and second register sets 453 and 454.

First register set 453 comprises a plurality of register zones 453a through 453b corresponding to zone select signals ZE0 through ZE15. As different zones are programmed according to the order illustrated in box 801 of FIG. 4, each of register zones 453a and 453b can store zone information for the different zones being programmed.

Each of register zones 453a and 453b comprises four registers ZR0 through ZR3. These registers each store information indicating a zone, such as an address. Each register can be selected based on one of zone select signals ZE0 through ZE15, and one of group select signals GE0 through GE3. For instance, a first register ZR0 in register zone 453a can be selected when zone select signal Z0 and group select signal G0 are activated.

Where detection signal OFF_DET is activated during a program operation of a first page of a selected wordline, second address WL_ADD[5:2] is stored in a register of first register set 453 that corresponds to the selected wordline. For instance, where wordline WL0 is selected, second address WL_ADD[5:2] is stored in first register ZR0 in first register zone 453a, which corresponds to zone 0 and group A as illustrated in FIG. 3.

In a program operation of another page of the selected wordline, such as an MSB page, second address WL_ADD[5:2] stored in register ZR0 of register zone 453a is provided to comparator 455. Comparator 455 compares the stored second address WL_ADD[5:2] with a received second address WL_ADD[5:2] of the other page to confirm that a first page of the selected wordline has been programmed and that a new zone is not being designated. Where the stored second address WL_ADD[5:2] matches the received second address WL_ADD[5:2], program code register 450 retrieves relevant program information from second register set 454 so that the other page is programmed using a start level of program voltage Vpgm based on the program information.

Second register set 454 comprises a plurality of register groups 454a through 454b corresponding zone select signals ZE0 through ZE15. As different zones are programmed according to the order illustrated in box 801 of FIG. 4, each of register groups 454a and 454b can store program information for groups within the different zones being programmed.

Each of register groups 454a and 454b comprises four registers GR0 through GR3. Each of these four registers stores a program code Vpgm_CODE that indicates a start level of program voltage Vpgm to be used when programming pages of a corresponding wordline. In particular, each register in second register set 454 corresponds to one of wordlines WL0 through WL63 based on program order illustrated in FIG. 4 and the zone information stored in first register set 453. For instance, register GR0 of register group 454a initially corresponds to wordline WL0. Accordingly, a program code Vpgm_CODE stored in register GR0 of register group 454a is used to indicate a start level of program voltage Vpgm for programming pages of wordline WL0 other than a first page.

A program code Vpgm_CODE is stored in a register of second register set 454 when detection signal OFF_DET is activated during programming of a first page of a corresponding selected wordline. The program code Vpgm_CODE is accessed from the register during programming of other pages of the selected wordline. Second register set 454 accesses the program code Vpgm_CODE in response to select signals E0 through E3 generated by comparator 455. Select signals E0 through E3 indicate a register in second register set 454 storing the relevant program code for programming a page other than a first page of a selected wordline.

Upon detecting an activated one of select signals E0 through E3, second register set 454 accesses a stored value of program code Vpgm_CODE from a register designated by select signals ZE0, GE0, and the activated one of select signals E0 through E3, and outputs the stored value as second default code D_CODE2.

In some embodiments, program voltage controller 480 is initialized by program controller 410 when a new memory block is selected. For example, where a previously selected memory block is different from a currently selected memory block, program controller 410 initializes program voltage controller 480 so that new information is stored in registers 450 and 461 are initialized. Because register 450 is used to store program codes and address information for one memory block, program code and address information for other memory blocks must be stored in program code register 450 through a re-initialization process.

The following is another example to explain the operation of a flash memory device in accordance with an embodiment of the inventive concept. This example will be described with reference to FIGS. 1 through 5. In this example, the flash memory device is an MLC flash memory device that stores three-bit data in each memory cell. A first page of data is stored in memory cells connected to a wordline WL0, and other pages of data are stored in the memory cells using a start level of a program voltage Vpgm based on program characteristics determined during programming of the first page of data. The first page of data is an LSB page and the other pages of data are an intermediate page and an MSB page.

In this example, a program operation is requested for the LSB page of wordline WL0. In response to the request, first default code D_CODE1 is transmitted to voltage generation circuit 300 under the control of program controller 410. More specifically, selector 460 of program voltage controller 480 selects first default code D_CODE1 stored in default code register 420 according to the request. The selected first default code D_CODE1 is loaded in counter 470.

In a first program loop of the program operation, first default code D_CODE1 transmitted from counter 470 to voltage generation circuit 300 without change. Voltage generation circuit 300 generates a program voltage Vpgm having a start level corresponding to first default code D_CODE1. Thereafter, memory cells in the selected page are programmed. After memory cells are programmed, a verification reading operation is performed to determine whether the selected memory cells are successfully programmed.

After the verification reading operation, off-cell detector 440 determines whether at least one of the selected memory cells is an off-cell. If at least one of the selected memory cells is judged to be an off-cell, off-cell detector 440 activates detection signal OFF_DET. Where at least one of the selected memory cells is judged not to be programmed into an off-cell, off-cell detector 440 does not activate detection signal OFF_DET. Where detection signal OFF_DET is not activated, an output of counter 470, i.e., program code Vpgm_CODE is not stored in program code register 450. Then, a next program loop is performed. Where the next program loop is performed, a value of counter 470 increases by ISPP code I_CODE and an increased code value, that is, the program code Vpgm_CODE is transmitted to voltage generation circuit 300. At this time, program voltage Vpgm increases by a value corresponding to ISPP code I_CODE, and a next program loop is performed.

Where detection signal OFF_DET is activated, the output of counter 470, i.e., program code Vpgm_CODE, is stored in program code register 450. More specifically, since a wordline WL0 is selected, first decoder 451 of the program voltage register 450 activates select signal GE0 according to first address WL_ADD[1:0] and second decoder 452 of the program voltage register 450 activates select signal ZE0 according to second address WL_ADD[5:2]. Where select signals GE0 and ZE0 are activated, second address WL_ADD[5:2] is stored in register ZR0 in first register zone 453a of first register set 453. At the same time, where select signals GE0 and ZE0 are activated, program code Vpgm_CODE is stored in the register in the first register group 454a of second register set 454. Where program code Vpgm_CODE is stored according to an activation of detection signal OFF_DET, an operation of off-cell detector 440 is not performed. Accordingly, detection signal OFF_DET is not activated in subsequent program loops. This operation is controlled by program controller 410.

The aforementioned operation is similarly applied when the first pages of remaining wordlines WL1 through WL63 are programmed, and therefore a description thereof will thus be omitted to avoid redundancy.

While a program operation is performed on the first pages among pages of the respective wordlines, program code Vpgm_CODE is stored in program code register 450 when an off-cell is first detected.

It is assumed that three-bit data is stored in selected memory cells and a program operation is requested with respect to an intermediate or MSB page of wordline WL0.

Where a program operation is requested with respect to an intermediate or MSB page of wordline WL0, one of first default code D_CODE1 and second default code D_CODE2 is transmitted to voltage generation circuit 300 as a program code under the control of program controller 410. More specifically, where a program operation is requested with respect to the intermediate or MSB page, selector 460 of program voltage controller 480 determines whether flag information, indicating whether the first page of the wordline WL0 is programmed or not, is stored in register 461. Where the flag information is not stored in register 461, selector 460 selects first default code D_CODE1. In other words, where a program operation is requested with respect to the remaining page(s) of the selected wordline and a flag for the first page of the selected wordline is not stored, first default code D_CODE1 is selected. This can occur where values stored in the register sets 453 and 454 are lost or a program operation for the first page of the selected wordline is omitted. That is, where values stored in the register sets 453 and 454 are lost, or where a program operation for the first page of the selected wordline is omitted, first default code D_CODE1 is selected by selector 460. The values stored in the register sets 453 and 454 can be lost, for instance, in a power-off operation or a change of a memory block.

Where flag information is stored in register 461 to indicate whether the first page of wordline WL0 is programmed, selector 460 selects second default code D_CODE2 stored in program code register 450. Because wordline WL0 is selected, second decoder 452 activates select signal ZE0. Where select signal ZE0 is activated, first register zone 453a of first register set 453 is selected, and first register group 454a in the second register set 454 is selected.

Values stored in registers ZR0 through ZR3 of register zone 453a are output to comparator 455. Where a program operation is requested with respect to the remaining pages of wordline WL0, comparator 455 determines whether the second addresses stored in the registers ZR0 through ZR3 of first register zone 453a coincide with second address WL_ADD[5:2] of the requested program operation.

Where any one of the second addresses stored in registers ZR0 through ZR3 coincides with second address WL_ADD[5:2] of the requested program operation, comparator 455 activates one (for example, E0) of select signals E0 through E3. Where select signal E0 is activated, program code Vpgm_CODE stored in register GR0 of first register group 454a, which is selected by select signal ZE0, is selected. The selected program code Vpgm_CODE is used to generate a program voltage Vpgm for the remaining pages of wordline WL0. The selected program code Vpgm_CODE is loaded in counter 470 as second default code D_CODE2. A program voltage Vpgm having a start level corresponding to second default code D_CODE2 is generated by voltage generation circuit 300. Thereafter, a program operation is performed using the generated start voltage.

An initial level (or a start level) of a program voltage of voltage generation circuit 300 is determined based on a program speed of memory cells in a wordline. More specifically, upon programming a first page of a selected wordline, such as an LSB page, a start level of a program voltage of a next page (for example, MSB page or intermediate and MSB pages) is determined based on a program characteristic, such as a program speed, of memory cells connected to the selected wordline. Accordingly, a start level of a program voltage of wordlines can be individually and independently controlled based on a program result of the first page of each wordline.

By independently controlling the respective start levels of program voltages for different wordlines, the number of program loops required to program certain pages can be reduced. Accordingly, programming speed and power consumption can be improved.

Figure 6:
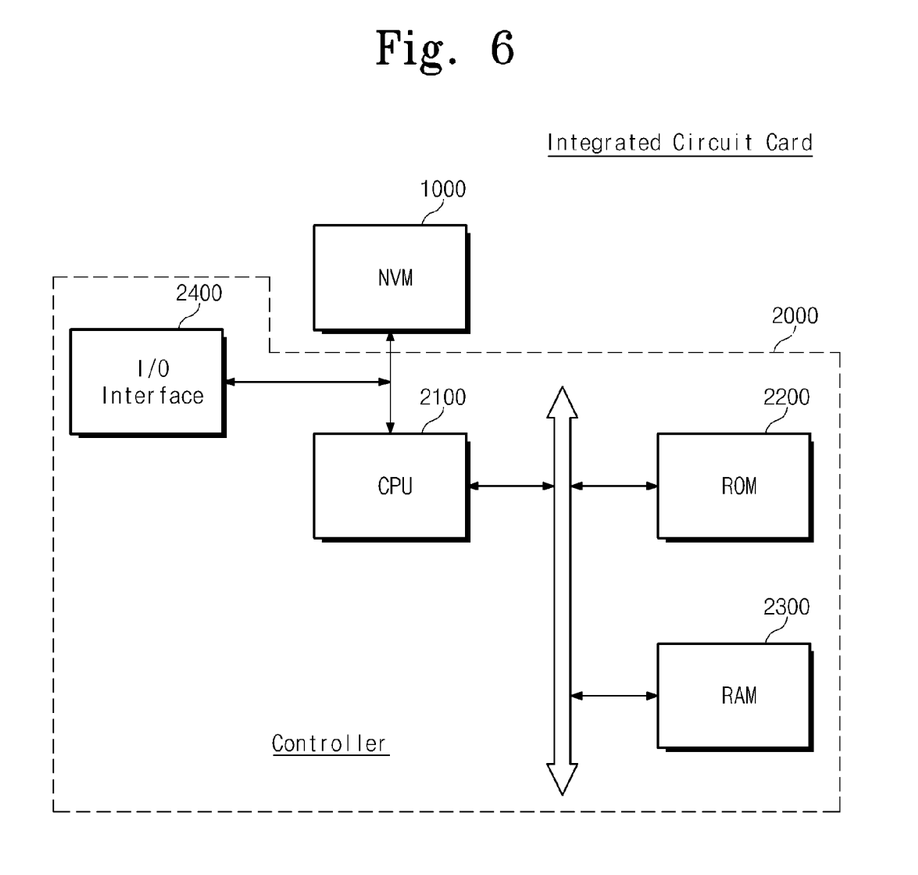
FIG. 6 is a block diagram illustrating an integrated circuit card comprising a flash memory device in accordance with an embodiment of the inventive concept.

FIG. 6 is a block diagram illustrating an integrated circuit card comprising a flash memory device in accordance with an embodiment of the inventive concept. The integrated circuit card can assume any of several forms, such as a smart card, a multimedia card, or others.

In the embodiment of FIG. 6, the integrated circuit card comprises a nonvolatile memory device 1000 and a controller 2000. Nonvolatile memory device 1000 is substantially identical to the nonvolatile memory device of FIG. 1, and therefore a detailed description of nonvolatile memory device 1000 will be omitted to avoid redundancy.

Controller 2000 controls nonvolatile memory device 1000 and comprises a CPU 2100, a ROM 2200, a RAM 2300 and an input/output interface 2400. CPU 2100 controls the overall operation of the integrated circuit card through various programs stored in the ROM 2200. RAM 2300 functions as a working memory for CPU 2100. Input/output interface 2400 provides an interface with external devices.

The integrated circuit card of FIG. 6 can be incorporated into a variety of electronic devices. As examples, it can be incorporated in various mobile devices, such as cellular phones, personal digital assistants (PDAs), digital cameras, portable game consoles, and MP3P. It can also be incorporated in various home applications, such as high definition televisions (HDTVs), digital video disks (DVDs), routers, and global positioning systems (GPS).

Figure 7:
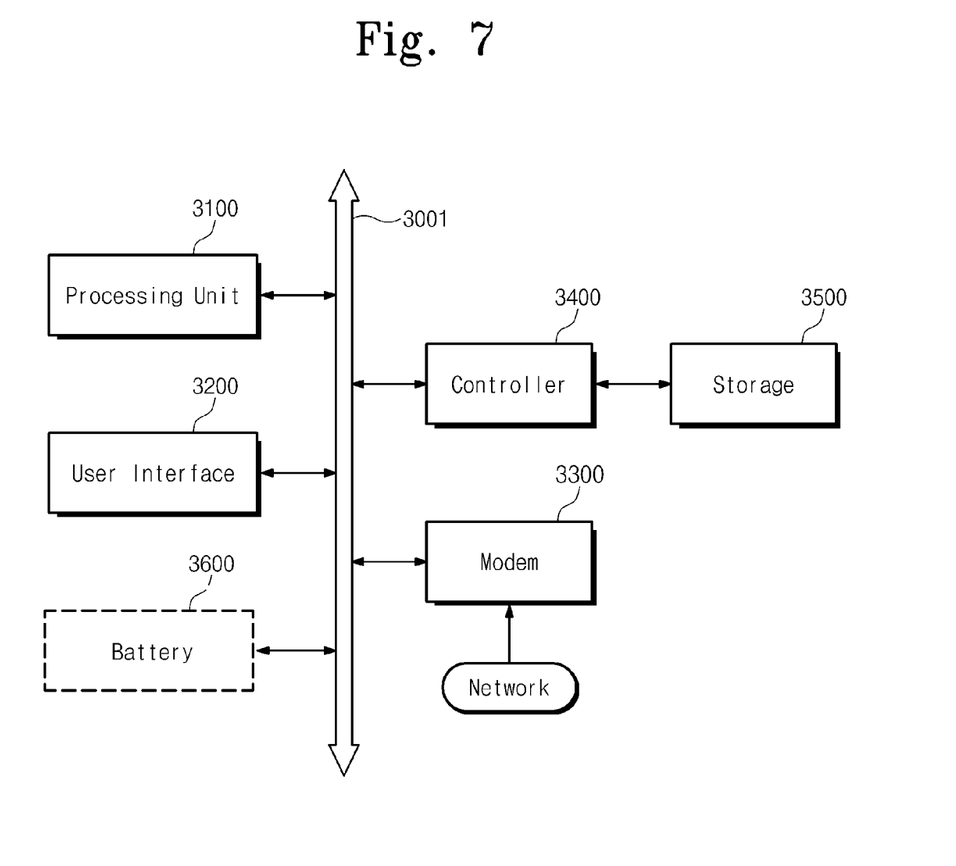
FIG. 7 is a block diagram illustrating a computing system comprising a flash memory device in accordance with an embodiment of the inventive concept.

FIG. 7 is a block diagram illustrating a computing system comprising a flash memory device in accordance with an illustrative embodiment of the inventive concept.

Referring to FIG. 7, the computing system comprises a microprocessor 3100, a user interface 3200, a modem 3300 such as a baseband chipset, a memory controller 3400, and a flash memory device 3500 as a storage media. Elements 3100 to 3400 are electrically connected to a system bus 3001.

Flash memory device 3500 is substantially identical to the flash memory device of FIG. 1. N-bit data (N≧1) processed/to be processed by the microprocessor 3100 is stored in flash memory device 3500 through memory controller 3400. Where the computing system of FIG. 7 is a mobile device, a battery 3600 can be used to provide an operating voltage. Although not illustrated in the drawings, the computing system can further comprise a number of additional elements, such as an application chipset, a camera image processor (CIS), or a mobile DRAM. In certain embodiments, memory controller 3400 and flash memory device 3500 are provided in the form of a solid state drive (SSD).

Figure 8:
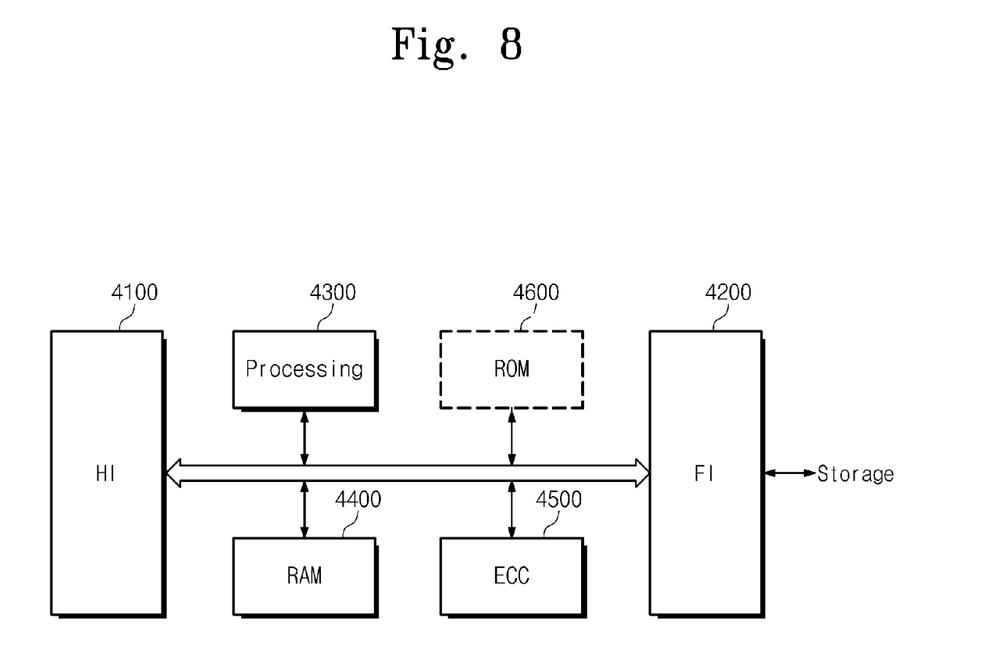
FIG. 8 is a block diagram illustrating an embodiment of a memory controller illustrated in FIG. 7.

FIG. 8 is a block diagram illustrating an embodiment of a memory controller such as that illustrated in FIG. 7.

In the embodiment of FIG. 8, the memory controller comprises a host interface 4100, a memory interface 4200, a processing unit 4300, a buffer memory 4400, and an error control unit 4500. Host interface 4100 is configured to interface with an external device, such as a host, and memory interface 4200 is configured to interface with a storage medium.

Processing unit 4300 is configured to control the overall operation of the memory controller. Buffer memory 4400 is used to temporarily store data to be stored in or read from a storage medium. Buffer memory 4400 can also be used as a work memory of processing unit 4300. Error control unit 4500 is configured to detect and correct errors of data read from a storage media. A ROM 4600 for storing code data may be additionally provided to the memory controller.

In various embodiments of the inventive concept, nonvolatile memory devices can be implemented with memory cells having any of various cell structures comprising a charge storage layer. The charge storage layer can comprise, for instance, a charge trap flash structure using a charge trap layer, a stack flash structure in which arrays are stacked in a multilayer, a flash structure without source-drain, and a pin-type flash structure. A memory device having a charge trap flash structure as a charge storage layer is disclosed in U.S. Pat. No. 6,858,906, U.S. Publication Patent No. 2004-0169238 and U.S. Publication Patent No. 2006-0180851, the respective disclosures of which are hereby incorporated by reference in their entirety. A flash structure without source-drain is disclosed in K.R. Patent No. 673,020, the disclosure of which is hereby incorporated by reference in its entirety.

In various embodiments of the inventive concept, a flash memory device and/or a memory controller can be mounted by various types of packages, such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), and wafer-level processed stack package (WSP).

As indicated by the foregoing, in certain embodiments of the inventive concept, the programming performance of a flash memory device is improved by determining a start level of a program voltage based on a program speed of memory cells connected to a wordline.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A flash memory device, comprising:
a memory cell array comprising a plurality of memory cells arranged in rows connected to corresponding wordlines, and columns connected to corresponding bitlines, wherein each row of memory cells is configured to store multiple pages of data through the corresponding wordline;
a voltage generation circuit configured to generate a program voltage to be applied to a selected wordline among the wordlines connected to the plurality of memory cells; and
a program voltage controller configured to detect a program characteristic of selected memory cells connected to the selected wordline during programming of a first page of data in the selected memory cells, and to control a start level of a program voltage to be applied to the selected memory cells in a program operation used to store a second page of data,
wherein the voltage generation circuit generates the program voltage based on a program code received from the program voltage controller, and
wherein during programming of the first page of data, the program voltage controller stores the program code with a modified value corresponding to the voltage applied to the selected memory cells in a program loop where a first off-cell is detected.

2. The flash memory device of claim 1, wherein the second page of data is an upper level page of data, and the first page of data is a lower level page of data.

3. The flash memory device of claim 1, wherein the start level of the program voltage is an initial voltage in an incremental step pulse programming method.

4. The flash memory device of claim 1, wherein the program voltage controller provides the program code with the modified value to the voltage generation circuit to determine the start level of the program voltage to be applied to the selected memory cells in the program operation used to store the second page of data.

5. The flash memory device of claim 1, wherein the program voltage controller determines whether the first page has been programmed before the second page is programmed.

6. The flash memory device of claim 5, wherein, upon determining that the first page has not been programmed, the program voltage controller designates a fixed default value as the start level of the program voltage to be applied to the selected memory cells in the program operation used to store the second page of data.

7. The flash memory device of claim 1, wherein the program characteristic of the first page is determined by a memory cell with a highest program speed among the selected memory cells.

8. A method of programming a flash memory device comprising memory cells arranged in wordlines and bitlines, comprising:
    programming a first page of data in selected memory cells using an incremental step pulse programming (ISPP) method with a program voltage having a first start level of a first magnitude;
    detecting a program loop of the ISPP method in which one or more of the selected memory cells becomes an off-cell, and storing a level of the program voltage in the detected program loop as a second magnitude;
    programming a second page of data in the selected memory cells using the ISPP method with the program voltage having a second start level of the second magnitude;
    upon receiving a request to program the second page of data, determining whether the first page of data is programmed in the selected memory cells; and
    upon determining that the first page of the selected wordline is not programmed in the selected memory cells, programming the second page of data using the ISPP method with the program voltage having the first start level of the first magnitude.

9. The method of claim 8, wherein the flash memory device is a NAND flash memory device having an all bitline architecture.

10. The method of claim 8, further comprising determining whether the selected memory cells are successfully programmed.

11. The method of claim 10, wherein determining whether the selected memory cells are successfully programmed is performed before or after detecting the program loop of the ISPP method in which one or more of the selected memory cells becomes the off-cell.

12. The method of claim 8, wherein the flash memory device is a multi-level cell flash memory device storing M bits per memory cell, where M is an integer greater than 2.

13. The method of claim 12, wherein the program voltage is determined by a program code that is updated in successive program loops of the ISPP method.

14. A memory system, comprising:
    a flash memory device; and
    a memory controller configured to control the flash memory device, wherein the flash memory device comprises:
    a memory cell array comprising memory cells arranged in rows and columns;
    a voltage generation circuit configured to generate a program voltage to be applied to selected memory cells in a row of the memory cell array; and
    a program voltage controller configured to control a start level of the program voltage such that a first page of data is programmed in the selected memory cells with the start level having a first value, and a second page of data is programmed in the selected memory cells with the start level having a second value based on a measured programming characteristic of the selected memory cells,
    wherein the voltage generation circuit generates the program voltage based on a program code received from the program voltage controller, and
    wherein during programming of the first page of data, the program voltage controller stores the program code with a modified value corresponding to the voltage applied to the selected memory cells in a program loop where a first off-cell is detected.

15. The memory system of claim 14, wherein the measured programming characteristic is a measure of a programming speed of the selected memory cells.

16. The memory system of claim 15, wherein the measure of the programming speed is a number of program loops in an incremental step pulse programming method.

* * * * *